United States Patent
Qi et al.

(10) Patent No.: US 11,940,299 B2
(45) Date of Patent: Mar. 26, 2024

(54) MAGNETORESISTIVE INERTIAL SENSOR CHIP

(71) Applicant: MultiDimension Technology Co., Ltd., Zhangjiagang (CN)

(72) Inventors: Bin Qi, Zhangjiagang (CN); Lixian Feng, Zhangjiagang (CN); Haiping Guo, Zhangjiagang (CN); Weifeng Shen, Zhangjiagang (CN); Songsheng Xue, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 150 days.

(21) Appl. No.: 17/594,149

(22) PCT Filed: Mar. 27, 2020

(86) PCT No.: PCT/CN2020/081618
§ 371 (c)(1),
(2) Date: Oct. 4, 2021

(87) PCT Pub. No.: WO2020/200076
PCT Pub. Date: Oct. 8, 2020

(65) Prior Publication Data
US 2022/0155105 A1    May 19, 2022

(30) Foreign Application Priority Data
Apr. 2, 2019  (CN) .......................... 201910262361.6

(51) Int. Cl.
*G01D 5/16*  (2006.01)
(52) U.S. Cl.
CPC ..................................... *G01D 5/16* (2013.01)

(58) Field of Classification Search
CPC ....... G01H 11/02; G01P 15/105; G01P 15/12; G01R 33/06; G01R 33/09–098; G01D 5/12; G01D 5/14; G01D 5/16
See application file for complete search history.

(56) References Cited

U.S. PATENT DOCUMENTS

| | | | | |
|---|---|---|---|---|
| 4,840,183 A | * | 6/1989 | Takahashi | H04R 1/46 600/528 |
| 5,497,082 A | * | 3/1996 | Hancock | G01D 5/145 324/207.2 |

(Continued)

FOREIGN PATENT DOCUMENTS

| CN | 1571582 A | * | 1/2005 |
|---|---|---|---|
| CN | 1571582 A | | 1/2005 |

(Continued)

OTHER PUBLICATIONS

"International Application No. PCT/CN2020/081618, International Search Report and Written Opinion dated Jul. 1, 2020", (dated Jul. 1, 2020), 17 pgs.

(Continued)

*Primary Examiner* — Huy Q Phan
*Assistant Examiner* — David B Frederiksen
(74) *Attorney, Agent, or Firm* — Schwegman Lundberg & Woessner, P.A.

(57) ABSTRACT

This invention describes a magnetoresistive inertial sensor chip, comprising a substrate, a vibrating diaphragm, a magnetic field sensing magnetoresistor and at least one permanent magnet thin film. The vibrating diaphragm is located on one side surface of the substrate. The magnetic field sensing magnetoresistor and the permanent magnet thin film are set on the surface of the vibrating diaphragm displaced from the base of the substrate. A contact electrode is also arranged on the surface of the vibrating diaphragm away from the base of the substrate. The magnetic field sensing magnetoresistor (Continued)

is connected to the contact electrode through a lead. The substrate comprises a cavity formed through etching and either one or both of the magnetic field sensing magnetoresistors and the permanent magnet thin film are arranged in a vertical projection area of the cavity in the vibrating diaphragm portion. A magnetic field generated by the permanent magnet thin film changes in the sensing direction of the magnetic field sensing magnetoresistor of magnetoresistive inertial sensor chip, which changes the resistance valve of the magnetic field sensing magnetoresistor, thereby producing a change in an output electrical signal. This magnetoresistive inertial sensor chip uses the high-sensitivity and high-frequency response characteristics of a magnetoresistor to improve the output signal strength and frequency response, thereby facilitating the detection of small and high frequency pressure, vibration, or acceleration changes.

13 Claims, 13 Drawing Sheets

(56) References Cited

U.S. PATENT DOCUMENTS

| | | | | |
|---|---|---|---|---|
| 6,507,187 | B1* | 1/2003 | Olivas | G01P 15/105 |
| | | | | 324/252 |
| 8,018,229 | B1* | 9/2011 | Horning | B82Y 25/00 |
| | | | | 324/252 |
| 2002/0178831 | A1 | 12/2002 | Takada | |
| 2005/0252293 | A1 | 11/2005 | Won et al. | |
| 2006/0126229 | A1* | 6/2006 | Grimm | G11B 5/00808 |
| 2010/0085041 | A1 | 4/2010 | Pozidis | |
| 2010/0118448 | A1* | 5/2010 | Yasui | G11B 5/3163 |
| | | | | 360/324.1 |
| 2010/0162813 | A1* | 7/2010 | Chen | G01C 19/5628 |
| | | | | 250/226 |
| 2011/0244599 | A1 | 10/2011 | Whig et al. | |
| 2014/0015525 | A1* | 1/2014 | Paci | G01R 33/09 |
| | | | | 324/252 |
| 2014/0026658 | A1 | 1/2014 | Zhang | |
| 2014/0026661 | A1 | 1/2014 | Zhang et al. | |
| 2014/0159717 | A1* | 6/2014 | Paci | G01R 33/0052 |
| | | | | 324/252 |
| 2017/0184687 | A1 | 6/2017 | Ostrick et al. | |
| 2018/0146296 | A1* | 5/2018 | Meisel | H04R 19/005 |

FOREIGN PATENT DOCUMENTS

| | | | |
|---|---|---|---|
| CN | 102721427 A | 10/2012 | |
| CN | 102854339 A | 1/2013 | |
| CN | 103076577 A | 5/2013 | |
| CN | 203279151 U | * 11/2013 | |
| CN | 107131819 A | 9/2017 | |
| CN | 109211281 A | 1/2019 | |
| CN | 109246566 A | 1/2019 | |
| CN | 109883456 A | 6/2019 | |
| CN | 109941956 A | 6/2019 | |
| CN | 209605842 U | 11/2019 | |
| JP | 2008224486 A | 9/2008 | |
| WO | WO-2016165361 A1 | * 10/2016 | ........... B81B 7/0064 |
| WO | WO-2020200076 A1 | 10/2020 | |

OTHER PUBLICATIONS

"European Application No. 20784217.0, Communication dated Dec. 1, 2022", (dated Dec. 1, 2022), 1 pg.

"European Application No. 20784217.0, Communication re European Search Report dated Nov. 14, 22", (dated Nov. 14, 2022), 18 pgs.

"European Application No. 20784217.0, European Search Report dated Nov. 4, 2022", (dated Nov. 4, 2022), 4 pgs.

"European Application No. 20784217.0, Letter to EPO confirming proceeding with application dated Jun. 12, 2023", (dated Jun. 12, 2023), 2 pgs.

"European Application No. 20784217.0, Noting Loss of Rights dated Jul. 4, 2023", (dated Jul. 4, 2023), 2 pgs.

* cited by examiner

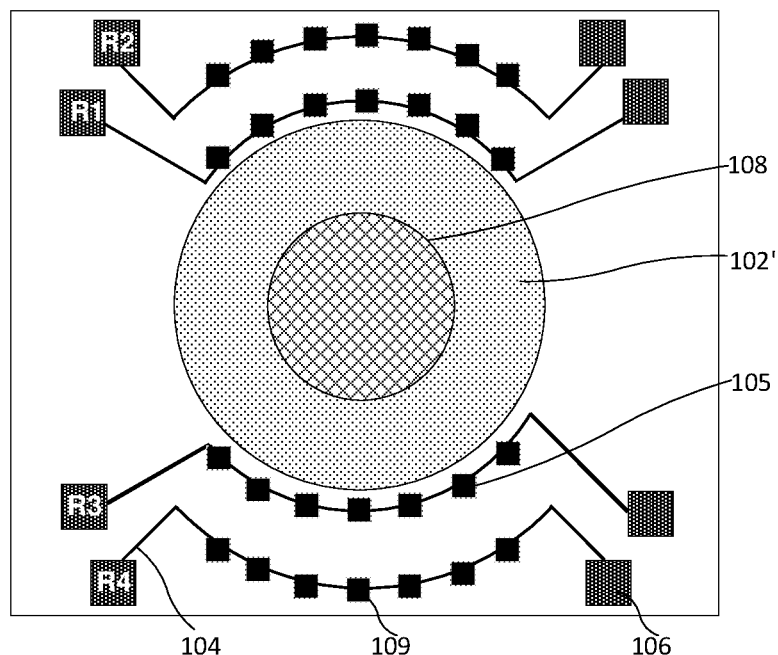
Fig. 10b
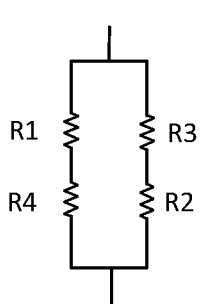   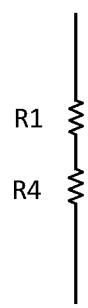   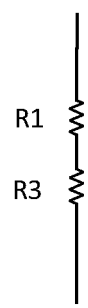   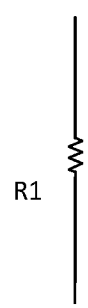
Fig. 11a   Fig. 11b   Fig. 11c   Fig. 11d

MAGNETORESISTIVE INERTIAL SENSOR CHIP

PRIORITY CLAIM TO RELATED APPLICATIONS

This application is a U.S. national stage filing under 35 U.S.C. § 371 from International Application No. PCT/CN2020/081618, filed on 27 Mar. 2020, and published as WO2020/200076 on 8 Oct. 2020, which claims the benefit under 35 U.S.C. 119 to Chinese Application No. 201910262361.6, filed on 2 Apr. 2019, the benefit of priority of each of which is claimed herein, and which applications and publication are hereby incorporated herein by reference in their entirety.

TECHNICAL FIELD

The present invention relates to the field of magnetic sensors, and more particularly to a magnetoresistive inertial sensor chip.

BACKGROUND

Over recent years, inertial sensor chips for measuring acceleration, vibration, and pressure have attracted great attention in various fields. Among those, the field of vibration sensors may be further divided into fields such as solid vibration detection, including building vibration and mechanical vibration; liquid vibration detection, including sonar hydrophones; and gas vibration, including microphone applications. Existing inertial sensor chips are mainly based on principles such as silicon-based capacitor, piezoelectricity, and silicon-based piezoresistance, and convert mechanical and physical quantities to be measured, such as acceleration, vibration, and pressure, to voltage or current signals for measurement. Silicon-based capacitor type sensor chips have good temperature stability, high sensitivity, and good temperature stability, but a narrow response frequency band; piezoelectricity type sensor chips have excellent temperature stability and time stability, and broad linear range, but low sensitivity; and silicon-based piezoresistance type sensor chips have high sensitivity and high dynamic response, can measure light pressure, but poor temperature stability. In addition, the above technologies are practically unable to detect vibration signals with frequency above 20 MHz.

Magnetoresistive materials specifically comprise those having tunneling magnetoresistance (TMR) with a structure consisted of a pinning layer, a free layer, and a non-magnetic tunnel barrier layer, those having giant magnetoresistance (GMR) with a structure consisted of a pinning layer, a free layer, and a non-magnetic conductive spacer layer; and those having anisotropic magnetoresistance (AMR) with a magnetic anisotropic layer structure. As magnetic field detection elements, magnetoresistive materials have excellent frequency response characteristics, good temperature characteristics, and high sensitivity. In combination with appropriate mechanical transfer structures and excitation structures, they can be used for specific inertial parameter measurement. In inertial parameter measurement, however, excitation structures and magnetoresistive elements respectively belong to designs of different planes in a space. As a result, despite the advantage that some production processes can be simplified, the overall yield is not high, the measurement linear interval is reduced, and the adjustment of relative spatial positions of mechanical transfer structures, excitation structures, and magnetoresistive elements is limited, thereby leading to a number of shortcomings, such as limited performance adjustment.

SUMMARY OF THE INVENTION

In view of the current situation that existing acceleration sensors have weak detection signals for or even cannot detect weak pressure and high-frequency vibration, the present invention proposes a magnetoresistive inertial sensor chip for high-sensitivity and high-frequency measurement and capable of detecting signals of little high-frequency vibration, pressure, or acceleration based on the characteristics of TMR/GMR/AMR magnetoresistive materials of rapid response by their own resistance to external magnetic field changes and the excellent temperature characteristics of TMR/GMR/AMR, and in combination with magnetic or non-magnetic vibrating diaphragms. Said magnetoresistive inertial sensor chip uses a magnetoresistor as a sensitive material, arranges a permanent magnet thin film as a signal transmitting source and the magnetoresistor as a signal receiving source on the same horizontal plane to maximize the signal linear interval, and converts a mechanical movement into an electric signal by using changes to resistance of the magnetoresistor as a result of changes to the magnetic field of the permanent magnet thin film, thereby accurately obtaining a signal of the vibration, acceleration, or pressure to be measured.

The present invention is implemented according to the following technical solution:
  a magnetoresistive inertial sensor chip, comprising a substrate, a vibrating diaphragm, a magnetic field sensing magnetoresistor, and at least one permanent magnet thin film, wherein
  the vibrating diaphragm is located on one side surface of the substrate, the magnetic field sensing magnetoresistor and the permanent magnet thin film are set on the surface of the vibrating diaphragm away from the base of the substrate, a contact electrode is also arranged on the surface of the vibrating diaphragm away from the base of the substrate, and the magnetic field sensing magnetoresistor is connected to the contact electrode through a connecting lead;
  the substrate comprises a cavity formed through etching, either one or both of the magnetic field sensing magnetoresistor and the permanent magnet thin film are arranged in a vertical projection area of the cavity on the vibrating diaphragm portion, and a component of a magnetic field generated by the permanent magnet thin film in the sensitivity direction of the magnetic field sensing magnetoresistor changes, causing the resistance value of the magnetic field sensing magnetoresistor to change, thereby leading to a change in an output electric signal.

Preferably, the magnetic field sensing magnetoresistor is arranged in an area other than the vertical projection area of the cavity on the vibrating diaphragm portion, and the permanent magnet thin film is arranged at the central position of the vertical projection area of the cavity on the vibrating diaphragm portion, or
  the magnetic field sensing magnetoresistor is arranged on the inner edge of the vertical projection area of the cavity on the vibrating diaphragm portion, and the permanent magnet thin film is arranged at the central position of the vertical projection area of the cavity on the vibrating diaphragm portion, or the magnetic field sensing magnetoresistor is arranged at the central position of the vertical projection area of the cavity on the vibrating diaphragm portion, and the permanent magnet thin film is arranged in an area other than the vertical projection area of the cavity on the vibrating diaphragm portion.

Preferably, the magnetoresistive inertial sensor chip further comprises a reference magnetoresistor, wherein the reference magnetoresistor is located on the surface of the vibrating diaphragm away from the base of the substrate and is arranged in an area other than the vertical projection area of the cavity on the vibrating diaphragm portion, and the reference magnetoresistor and the magnetic field sensing magnetoresistor are connected into a full-bridge or half-bridge structure through an encapsulation lead.

Preferably, a side of the reference magnetoresistor away from the vibrating diaphragm is provided with a magnetic shielding layer comprising a soft magnetic material, and the magnetic shielding layer covers the reference magnetoresistor.

Preferably, the reference magnetoresistor and the magnetic field sensing magnetoresistor are a tunneling magnetoresistor, a giant magnetoresistor, or an anisotropic magnetoresistor.

Preferably, the magnetoresistive inertial sensor chip further comprises an encapsulation structure consisting of an encapsulation substrate and an encapsulation housing, wherein the substrate is disposed inside a cavity formed by the encapsulation substrate and the encapsulation housing and is fixed on the encapsulation substrate.

Preferably, the encapsulation housing comprises one or more layers of magnetic field shielding shells made of soft magnetic materials, one or more layers of electric field shielding shells made of metal foils, or a shell formed by stacking the magnetic field shielding shells and the electric field shielding shells.

Preferably, the encapsulation substrate or the encapsulation housing is provided with at least one opening.

Preferably, the thickness of the vibrating diaphragm is 0.001 μm to 1000 μm, the edge of the contact face between the cavity and the vibrating diaphragm is a circle, an ellipse, a rectangle, or a parallelogram, and the length-width ratio of the enclosing rectangle of the contact face between the cavity and the vibrating diaphragm is in a range of 20:1 to 1:1, wherein the width of the enclosing rectangle of the contact face is in a range of 0.1 μm to 2000 μm.

Preferably, the vibrating diaphragm comprises a plurality of through holes formed through etching.

Preferably, the permanent magnet thin film is one or more layers of hard magnetic materials, or [soft magnet/antiferromagnet]n formed by composite units consisting of a soft magnetic material and an antiferromagnetic material, or [soft magnet/hard magnet]n formed by composite units consisting of a soft magnetic material and a hard magnetic material, wherein n is a natural number, the hard magnetic material comprises at least one of CoPt, CoCrPt, and FePt, the soft magnetic material comprises at least one of FeCo and NiFe, and the antiferromagnetic material comprises at least one of PtMn and IrMn.

Preferably, the magnetizing direction of the permanent magnet thin film is in the plane of the permanent magnet thin film or perpendicular to the plane of the permanent magnet thin film, and the sensitivity direction of the magnetic field sensing magnetoresistor is in the plane of the permanent magnet thin film or perpendicular to the plane of the permanent magnet thin film.

Preferably, the sensor chip comprises a feedback coil;

the feedback coil is a plane etched coil that is located on the surface of the vibrating diaphragm away from the base of the substrate and is arranged in an area other than the vertical projection area of the cavity on the vibrating diaphragm portion, or the feedback coil is a winding coil disposed right above the permanent magnet thin film or disposed right below the permanent magnet thin film and is arranged below the cavity or inside the cavity.

Compared with the prior art, the present invention has the following advantageous technical effects:

the present invention uses the vibrating diaphragm to transmit a change in external pressure, vibration, or acceleration, uses a magnetoresistor as a sensitive material to convert a mechanical movement of the vibrating diaphragm into a change in the resistance value of the magnetoresistor, arranges the magnetoresistor element and a permanent magnet thin film as an excitation structure on the same surface of the vibrating diaphragm, such that the magnetoresistor element and the permanent magnet thin film are located on the same reference plane, which facilitates the adjustment of relative spatial positions of the vibrating diaphragm as a mechanical transfer structure, the permanent magnet thin film as an excitation structure, and the magnetoresistive element, and favors the improvement of the linear interval of output signals from the sensor and the sensor yield; and uses the high-sensitivity and high-frequency response characteristics of the magnetoresistor to improve the output signal strength and frequency response, thereby facilitating the detection of small and high frequency pressure, vibration, or acceleration changes.

BRIEF DESCRIPTION OF THE DRAWINGS

By reading the detailed description of non-limiting embodiments made with reference to the following drawings, other features, goals, and advantages of the present invention will become more apparent:

FIG. 10a and FIG. 10b are top views of the other two magnetoresistive inertial sensor chips according to embodiments of the present invention;

FIG. 11a to FIG. 11d are schematic diagrams of magnetoresistive bridge connection modes according to embodiments of the present invention;

DETAILED DESCRIPTION

The present invention will be described in detail below in combination with specific embodiments. The following embodiments will help those skilled in the art further understand the present invention, but do not limit the present invention in any manner. It should be noted that, to those of ordinary skills in the art, a number of variations and improvements may be further made without departing from the concept of the present invention, all of which fall within the scope of protection of the present invention.

In the description of the present invention, it should be understood that directional or positional relations indicated by the terms "radial," "axial," "up," "down," "top," "bottom," "inner," and "outer" are directional or positional relations based on the accompanying drawings and are only used to facilitate the description of the present invention and to simplify the description, rather than indicating or implying that the indicated devices or elements must have a particular direction or be constructed and operated in a particular direction. Therefore, they cannot be construed as limitations to the present invention. In the description of the present invention, "multiple" means two or more, unless otherwise specifies.

In the description of the present invention, it should be noted that, unless otherwise specifically prescribed or defined, the terms "install," "set," and "connect" should be understood in their broad meanings. For example, it may be a fixed connection, a removable connection, or an integral connection; it may be a direct connection or an indirect connection via an intermediary. To those of ordinary skills in the art, the specific meanings of the above terms in the present invention may be understood according to specific situations.

In the prior art, the permanent magnet thin film and the magnetic field sensing magnetoresistor of a magnetoresistive inertial sensor are not on the same plane, and the two are of a vertical structure. As limited by materials of the vibration structure, the adjustment of relative vertical positions is limited. Furthermore, due to the linear requirements of output signals, the adjustment of relative horizontal positions is limited. As a result, the structure design is very limited.

Figure 1:
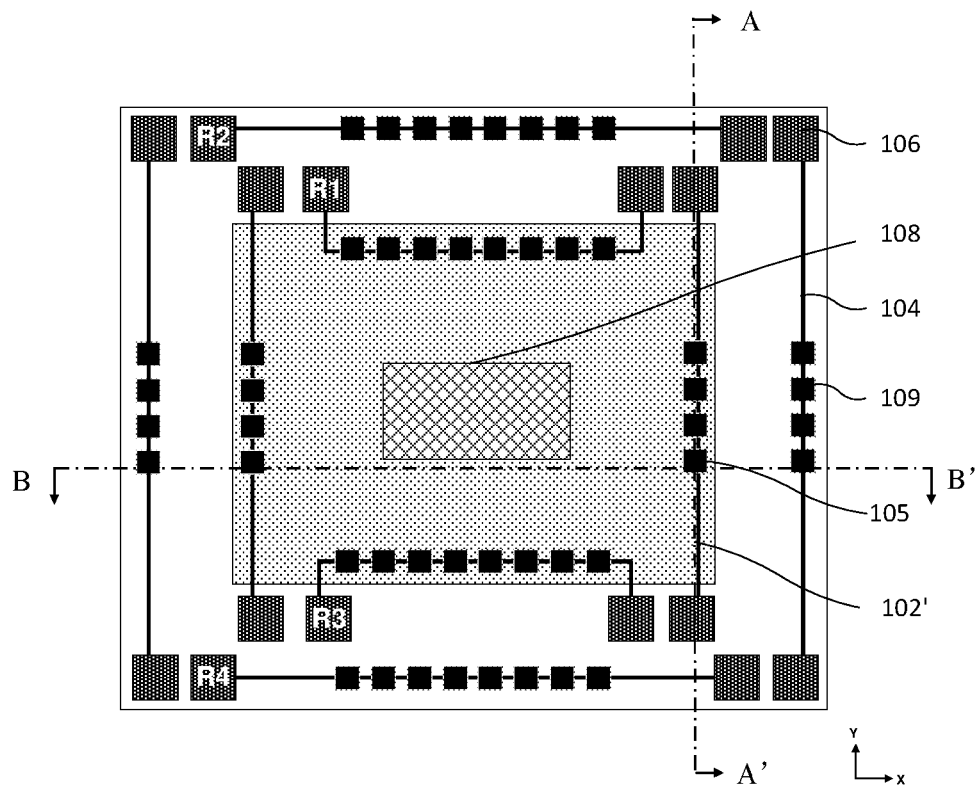
FIG. 1 is a top view of a magnetoresistive inertial sensor chip according to an embodiment of the present invention.
Figure 2A:
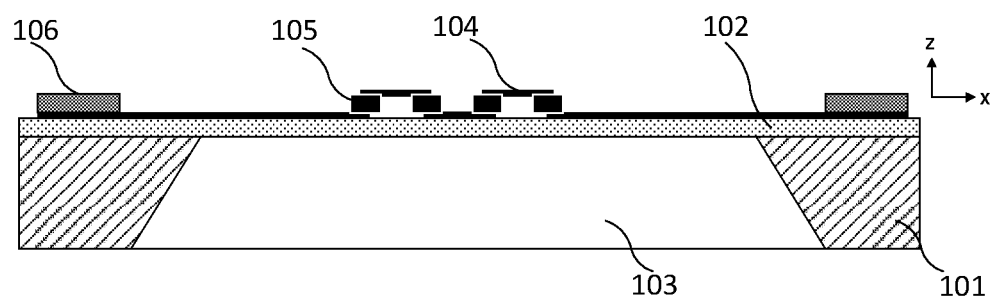
FIG. 2a is a cross-sectional view of a magnetoresistive inertial sensor chip according to an embodiment of the present invention.
Figure 2B:
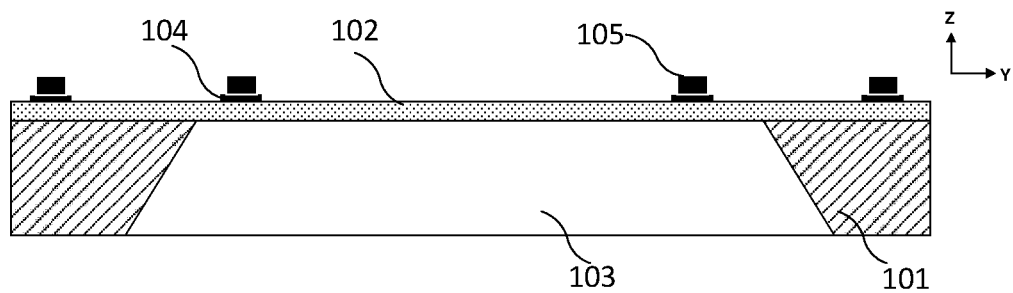
FIG. 2b is a cross-sectional view of another magnetoresistive inertial sensor chip according to an embodiment of the present invention.

Based on the above-described problems, embodiments of the present invention provide a magnetoresistive inertial sensor chip. FIG. 1 is a top view of a magnetoresistive inertial sensor chip according to an embodiment of the present invention, FIG. 2a is a cross-sectional view of a magnetoresistive inertial sensor chip according to an embodiment of the present invention, and FIG. 2a is a cross-sectional view along the section line A-A' in FIG. 1; FIG. 2b is a cross-sectional view of another magnetoresistive inertial sensor chip according to an embodiment of the present invention, and FIG. 2b is a cross-sectional view along the section line B-B' in FIG. 1; referring to FIG. 1, FIG. 2a, and FIG. 2b, the magnetoresistive inertial sensor chip comprises a substrate 101, a vibrating diaphragm (corresponding to the legend 102' in FIG. 1, and corresponding to the legend 102 in FIG. 2a and FIG. 2b), a magnetic field sensing magnetoresistor 105, and at least one permanent magnet thin film 108. The substrate 101 is one of monocrystalline silicon, metals, and ceramic, the vibrating diaphragm covers the top surface of the substrate 101, the magnetic field sensing magnetoresistor 105 and the permanent magnet thin film 108 are arranged on the top surface of the vibrating diaphragm. Optionally, the top surface and the bottom surface of the vibrating diaphragm are planes. A contact electrode 106 is arranged on the top surface of the vibrating diaphragm, and the magnetic field sensing magnetoresistor 105 is connected to the contact electrode 106 through a connecting lead 104. The substrate 101 comprises a cavity 103, wherein the cavity 103 may be formed through etching of the substrate 101. The cavity 103 is located at the bottom side of the vibrating diaphragm, either one or both of the magnetic field sensing magnetoresistor 105 and the permanent magnet thin film 108 are arranged in a vertical projection area of the cavity 103 on the vibrating diaphragm 102. When there is a relative displacement between the permanent magnet thin film 108 and the magnetic field sensing magnetoresistor 105, a component of a magnetic field generated by the permanent magnet thin film 108 in the sensitivity direction of the magnetic field sensing magnetoresistor 105 changes, causing the resistance value of the magnetic field sensing magnetoresistor 105 to change, thereby leading to a change in an output electric signal. It should be noted that, to make the accompanying drawings clearer, only a portion of the vibrating diaphragm 102' corresponding to the cavity is shown in FIG. 1, and the entire vibrating diaphragm 102 is shown in FIG. 2a and FIG. 2b. In the following embodiments, the legend 102' is also used to represent the portion of the vibrating diaphragm corresponding to the cavity.

In the embodiments of the present invention, the permanent magnet thin film 108 serves as an excitation structure and is arranged on the same surface of the vibrating diaphragm as the magnetic field sensing magnetoresistor 105, such that the permanent magnet thin film 108 and the magnetic field sensing magnetoresistor 105 are located on the same reference plane. Since the adjustment of horizontal positions of the permanent magnet thin film 108 and the magnetic field sensing magnetoresistor 105 does not have a significant impact on the signal linearity, the structure design of the magnetoresistive inertial sensor chip is more diverse compared with conventional magnetoresistive inertial sensor chips, which facilitates the adjustment of relative spatial positions of the vibrating diaphragm as a mechanical transfer structure, the permanent magnet thin film as an excitation structure, and the magnetoresistive element.

It should be noted that FIG. 1 only schematically shows the situation in which the permanent magnet thin film 108 is arranged at a central position of the vibrating diaphragm, and the magnetic field sensing magnetoresistor 105 is arranged in an area other than the vertical projection area of the cavity 103 on the vibrating diaphragm. There is no specific limitation to the positions of the magnetic field sensing magnetoresistor 105 and the permanent magnet thin film 108 in the embodiments of the present invention, as long as the condition that either one or both of the magnetic field sensing magnetoresistor 105 and the permanent magnet thin film 108 are arranged in a vertical projection area of the cavity 103 on the vibrating diaphragm.

The magnetoresistive inertial sensor chip according to the present embodiment uses the vibrating diaphragm to transmit a change in external pressure, vibration, or acceleration, uses a magnetoresistor as a sensitive material to convert a mechanical movement of the vibrating diaphragm into a change in the resistance value of the magnetoresistor, arranges the magnetoresistor element and a permanent magnet thin film as an excitation structure on the same surface of the vibrating diaphragm, such that the magnetoresistor element and the permanent magnet thin film are located on the same reference plane, which facilitates the adjustment of relative spatial positions of the vibrating diaphragm as a mechanical transfer structure, the permanent magnet thin film as an excitation structure, and the magnetoresistive element, and favors the improvement of the linear interval of output signals from the sensor and the sensor yield; and uses the high-sensitivity and high-frequency response characteristics of the magnetoresistor to improve the output signal strength and frequency response, thereby facilitating the detection of small and high frequency pressure, vibration, or acceleration changes.

A magnetoresistor that is sensitive to changes to the magnetic field of the permanent magnet thin film is used as the magnetic field sensing magnetoresistor, a magnetoresistor that is insensitive to changes to the magnetic field of the permanent magnet thin film is used as a reference magnetoresistor, and the reference magnetoresistor is set to be spaced apart from the permanent magnet thin film by a certain distance, which further weakens the impact of the magnetic field of the permanent magnet thin film on the reference magnetoresistor. If necessary, a magnetic shielding layer 107 comprising a soft magnetic material covers the reference magnetoresistor to eliminate the impact of the magnetic field, thereby ensuring the stable resistance value of the reference magnetoresistor.

Figure 3:
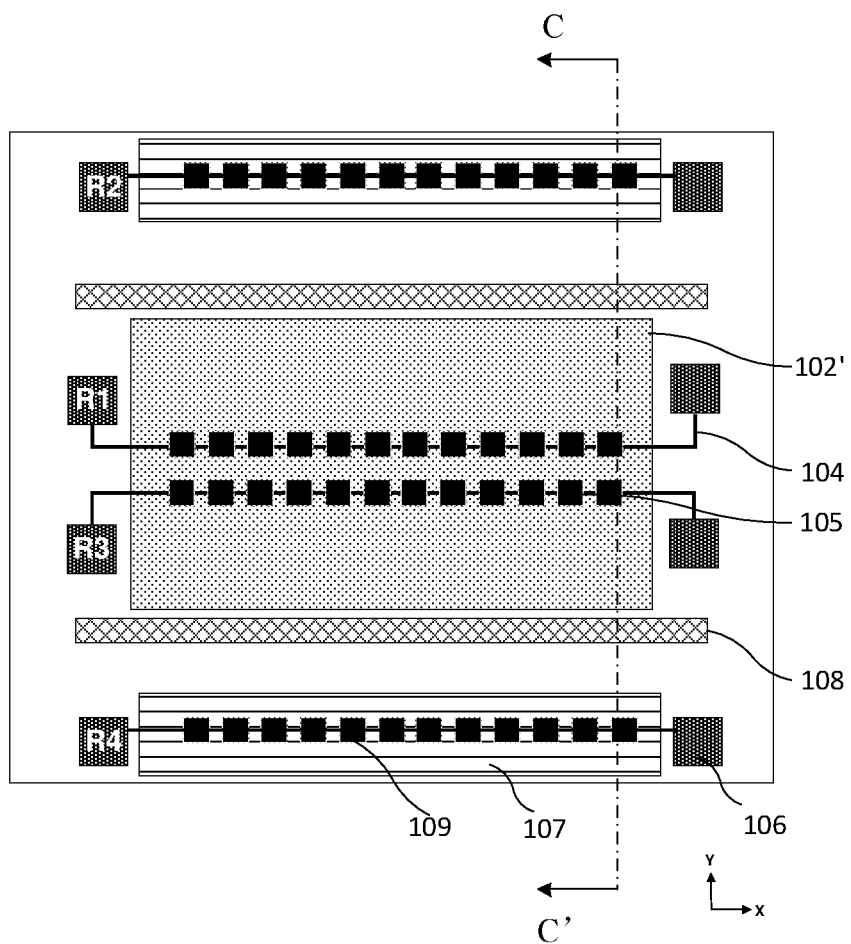
FIG. 3 is a top view of another magnetoresistive inertial sensor chip according to an embodiment of the present invention.
Figure 4:
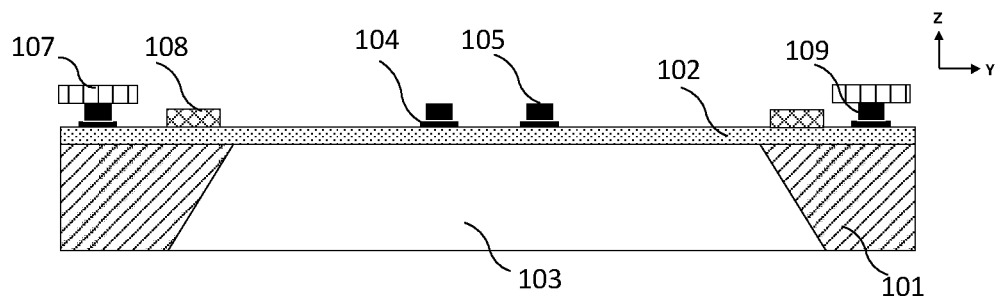
FIG. 4 is a cross-sectional view of another magnetoresistive inertial sensor chip according to an embodiment of the present invention.

FIG. 3 is a top view of another magnetoresistive inertial sensor chip according to an embodiment of the present invention, FIG. 4 is a cross-sectional view of another magnetoresistive inertial sensor chip according to an embodiment of the present invention, and FIG. 4 is a cross-sectional view along the section line C-C' in FIG. 3. Referring to FIG. 3 and FIG. 4, the sensor chip according to the present invention further comprises a reference magnetoresistor 109, wherein the reference magnetoresistor 109 is arranged on the top surface of the vibrating diaphragm and is arranged in an area other than the vertical projection area of the cavity 103 on the vibrating diaphragm, and the reference magnetoresistor 109 and the magnetic field sensing magnetoresistor 105 according to the present invention are connected into a full-bridge or half-bridge structure through an encapsulation lead, or the magnetic field sensing magnetoresistor separately forms a structure with a single arm.

Still referring to FIG. 3 and FIG. 4, the magnetic shielding layer 107 comprising a soft magnetic material covers the top of the reference magnetoresistor 109, which then shields the impact of changes to the magnetic field generated by the permanent magnet thin film 108 on the resistance value of the reference magnetoresistor 109.

According to a specific embodiment of the present invention, the reference magnetoresistor 109 and the magnetic field sensing magnetoresistor 105 according to the present invention are a tunneling magnetoresistor, a giant magnetoresistor, or an anisotropic magnetoresistor.

According to the present invention, the magnetizing direction of the permanent magnet thin film is in the plane of the permanent magnet thin film or perpendicular to the plane of the permanent magnet thin film, and the sensitivity direction of the magnetic field sensing magnetoresistor is in the plane of the permanent magnet thin film or perpendicular to the plane of the permanent magnet thin film. In combination with FIG. 4, according to a specific embodiment of the present invention, the sensitivity direction of the magnetic field sensing magnetoresistor in the present invention is set to be along the Y direction, and meanwhile, the permanent magnet thin film is magnetized along the Z direction. The magnetoresistor is used to detect the component of the magnetic field at the position of the magnetoresistor in the Y direction when an external pressure, vibration, or acceleration causes a displacement of the permanent magnet thin film in the Z direction, and to detect the pressure/vibration/acceleration by determining the displacement change. The sensitivity direction of the magnetoresistor and the magnetizing direction of the permanent magnet thin film both can be perpendicular to the plane direction of the vibrating diaphragm or any direction in the plane of the diaphragm.

Figure 5A:
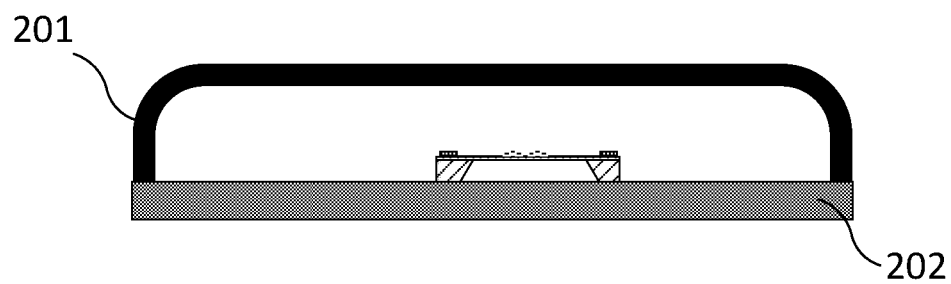
FIG. 5a is a schematic structural diagram of another magnetoresistive inertial sensor chip according to an embodiment of the present invention.
Figure 5B:
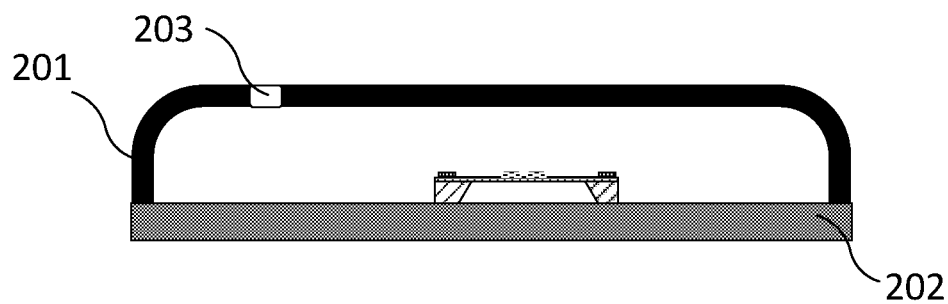
FIG. 5b is a schematic structural diagram of another magnetoresistive inertial sensor chip according to an embodiment of the present invention.
Figure 5C:
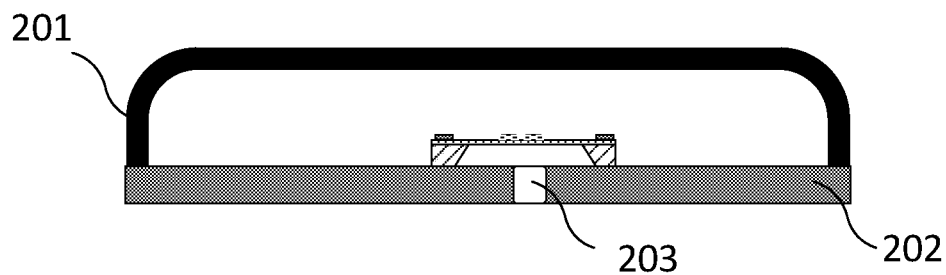
FIG. 5c is a schematic structural diagram of another magnetoresistive inertial sensor chip according to an embodiment of the present invention.

FIG. 5a is a schematic structural diagram of another magnetoresistive inertial sensor chip according to an embodiment of the present invention, FIG. 5b is a schematic structural diagram of another magnetoresistive inertial sensor chip according to an embodiment of the present invention, and FIG. 5c is a schematic structural diagram of another magnetoresistive inertial sensor chip according to an embodiment of the present invention. Referring to FIGS. 5a-5c, according to a specific embodiment of the present invention, the sensor chip according to the present invention further comprises an encapsulation structure consisting of an encapsulation substrate 202 and an encapsulation housing 201, wherein the substrate 101 is disposed inside a cavity formed by the encapsulation substrate 202 and the encapsulation housing 201, and is fixed on the encapsulation substrate 202.

The encapsulation structure may be formed with one or more openings 203 for transferring external pressure or vibration. When acoustic vibration (e.g., a microphone) or liquid/gas pressure needs to be transferred, the encapsulation openings are needed so that the liquid/gas is in contact with the chip. Openings are not needed for measuring acceleration. According to a specific embodiment of the present invention, one or more openings 203 may be formed on the encapsulation substrate 202 or the encapsulation housing 201 according to needs of actual application scenarios, as shown in FIG. 5a to FIG. 5c, wherein FIG. 5a shows an encapsulation structure without openings, FIG. 5b shows that the openings are located on the encapsulation housing, and FIG. 5c shows that the openings are located on the encapsulation substrate.

In addition, the encapsulation housing 201 according to the present invention comprises one or more layers of magnetic field shielding shells made of soft magnetic materials, one or more layers of electric field shielding shells made of metal foils, or a shell formed by stacking the magnetic field shielding shells and the electric field shielding shells, which may be selected according to actual needs.

Figure 6A:
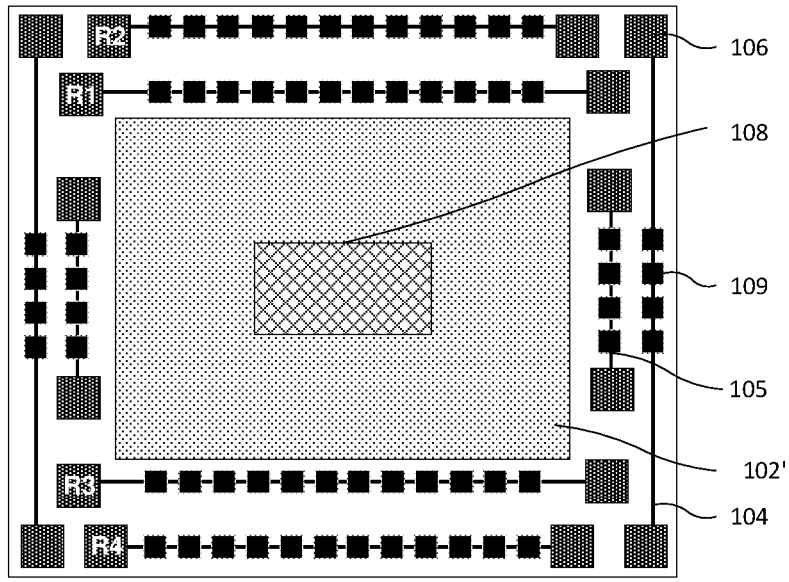
FIG. 6a is a top view of another magnetoresistive inertial sensor chip according to an embodiment of the present invention.
Figure 6B:
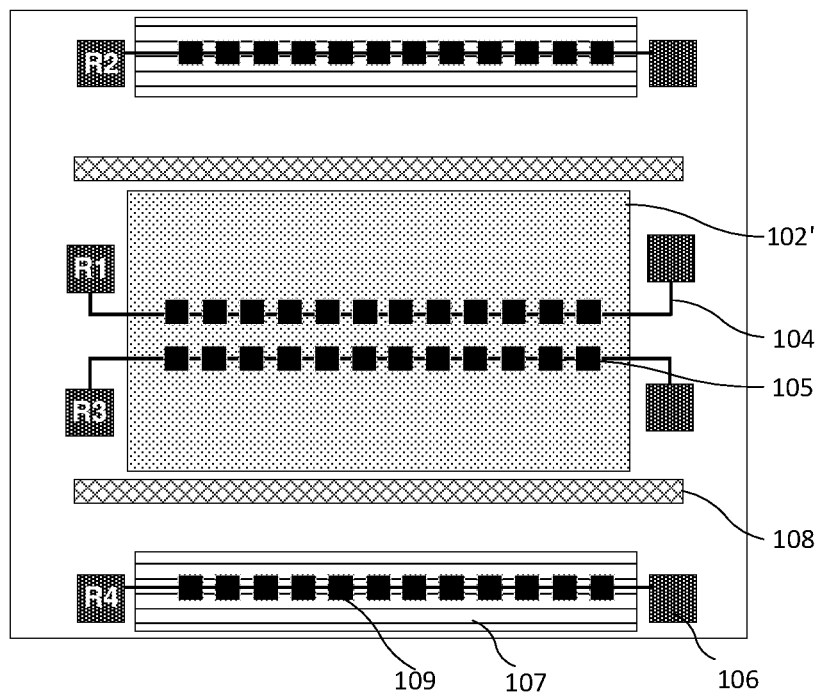
FIG. 6b is a top view of another magnetoresistive inertial sensor chip according to an embodiment of the present invention.

FIG. 6a is a top view of another magnetoresistive inertial sensor chip according to an embodiment of the present invention, and FIG. 6b is a top view of another magnetoresistive inertial sensor chip according to an embodiment of the present invention. FIG. 1, FIG. 6a, and FIG. 6b are top views of three representative tunneling magnetoresistive inertial sensor chip according to the present invention, wherein, along the X direction, R1 and R3 are magnetic field sensing magnetoresistors, R2 and R4 are reference magnetoresistors, and signals are led out by the contact electrode 106. As shown in FIG. 1 and FIG. 6a, the permanent magnet thin film may be arranged at the central position of the vibrating diaphragm, and the magnetizing direction is perpendicular to the surface of the permanent magnet diaphragm or parallel to any pair of edges of the permanent magnet diaphragm. As shown in FIG. 6a, the magnetic field sensing magnetoresistors may be located in an area other than the vertical projection area on the vibrating diaphragm portion, or as shown in FIG. 1, the magnetoresistors may be located in an inner edge area inside the vertical projection area of the cavity on the vibrating diaphragm portion. As impacted by external vibration/acceleration/pressure, the vibrating diaphragm drives the permanent magnet thin film to move in a direction perpendicular to the diaphragm, causing a change in the magnetic field strength at the positions of the magnetoresistors, and then causing a change in the resistance values of the magnetoresistors. Alternatively, as shown in FIG. 6b, the magnetoresistors are arranged at the central position inside the projection of the cavity, and the permanent magnet thin film is arranged outside the vertical projection area of the cavity on the vibrating diaphragm portion. As impacted by external vibration/acceleration/pressure, the diaphragm moves in a direction perpendicular to the diaphragm, causing a relative displacement between the magnetoresistors and the permanent magnet thin film on the diaphragm, such that the magnetic field strength at the positions of the magnetoresistors changes, thereby causing a change in the resistance values of the magnetoresistors.

Also referring to FIG. 4, reference magnetoresistors R2 and R4 are arranged at positions outside the cavity. The reference magnetoresistors are not affected by the magnetic field generated by the permanent magnet thin film, and their resistance values remain unchanged when the magnetic field changes as a result of the displacement of the permanent magnet thin film. A magnetic shielding layer may cover the top of the reference magnetoresistors to reduce the impact of changes to the magnetic field. When required by an application scenario, R1 and R3 are linked in the form of a full bridge or half bridge to convert vibration into an electric signal for output. In the case of acceleration calculation, when R1 and R3 form a branch, and R2 and R4 form a branch to construct a full bridge, and if acceleration causes a displacement of the permanent magnet thin film, the resistance of the branch formed by R1 and R3 consequently increases, the resistance of the branch formed by R2 and R4 remains unchanged, and the full-bridge voltage signal changes from zero to a positive value. The amount of change in the magnetic field at the branch of R1 and R3, the displacement of the permanent magnet thin film is obtained through back calculation according to the magnetic field-displacement relationship, and then the acceleration is obtained in combination with the time that causes such displacement.

Figure 7A:
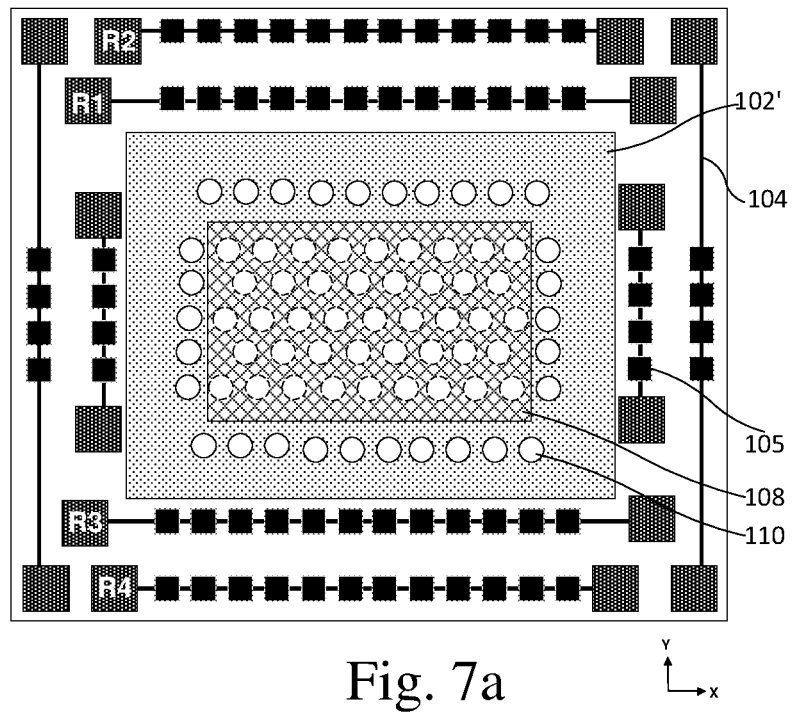
FIG. 7a is a top view of another magnetoresistive inertial sensor chip according to an embodiment of the present invention.
Figure 7B:
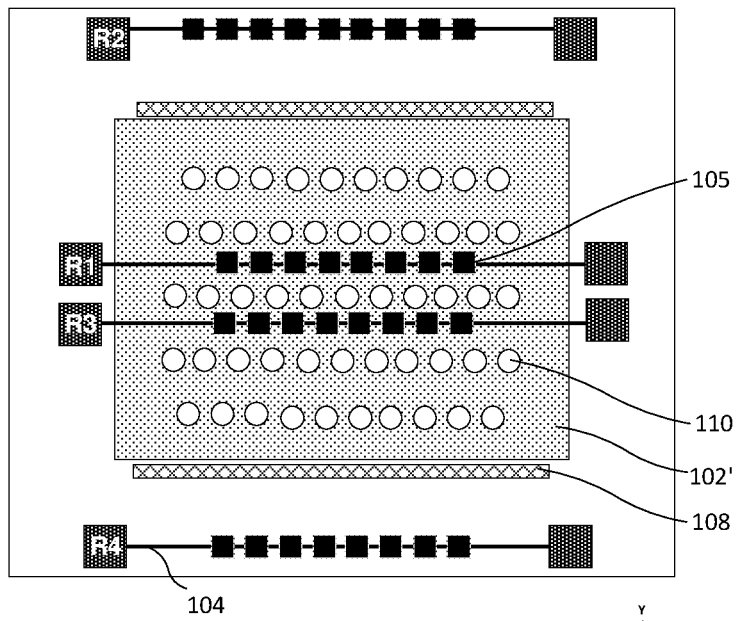
FIG. 7b is a top view of another magnetoresistive inertial sensor chip according to an embodiment of the present invention.
Figure 7C:
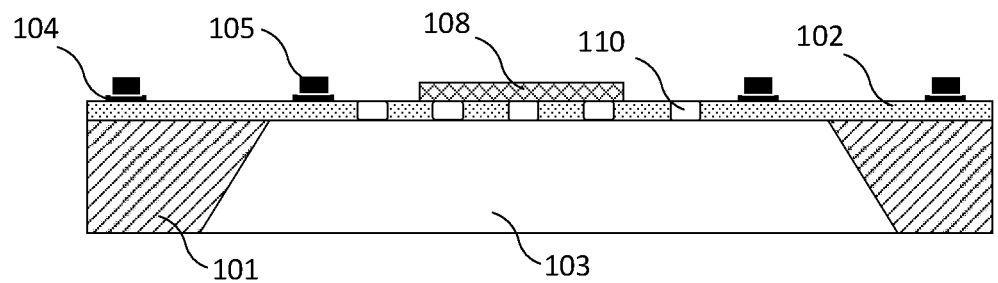
FIG. 7c is a cross-sectional view of another magnetoresistive inertial sensor chip according to an embodiment of the present invention.

FIG. 7a is a top view of another magnetoresistive inertial sensor chip according to an embodiment of the present invention; FIG. 7b is a top view of another magnetoresistive inertial sensor chip according to an embodiment of the present invention; and FIG. 7c is a cross-sectional view of another magnetoresistive inertial sensor chip according to an embodiment of the present invention. Referring to FIG. 7a to FIG. 7c, the vibrating diaphragm 102 is etched with a plurality of through holes 110, thereby improving the vibration transfer efficiency. The projections of the through holes 110 on the vibrating diaphragm do not overlap with the projections of the magnetoresistors and leads and electrodes thereof. The holes are formed after the magnetoresistors and leads are provided, since holes cannot be formed in the area where the magnetoresistors and leads are located, otherwise the magnetoresistors and leads will be knocked off.

Figure 8A:
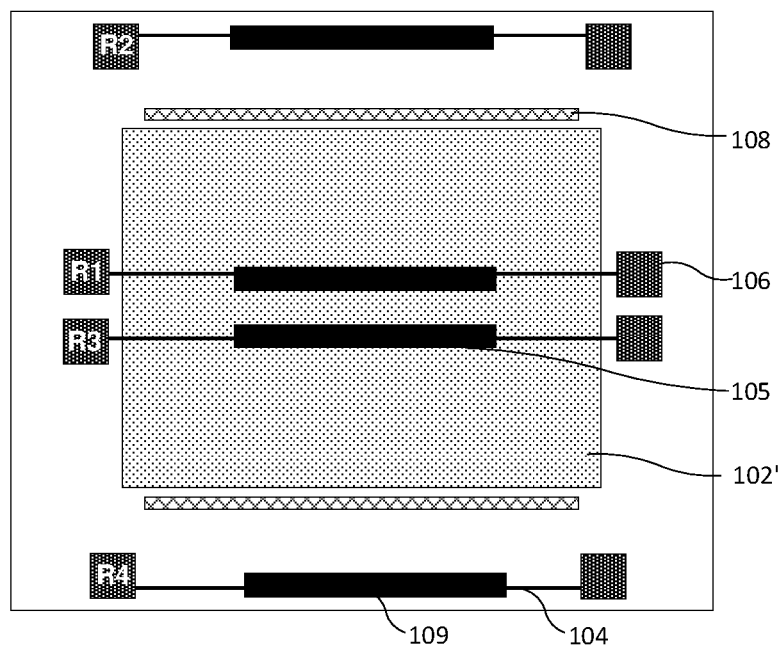
FIG. 8a and FIG. 8b are top views of the other two magnetoresistive inertial sensor chips according to embodiments of the present invention.
Figure 8B:
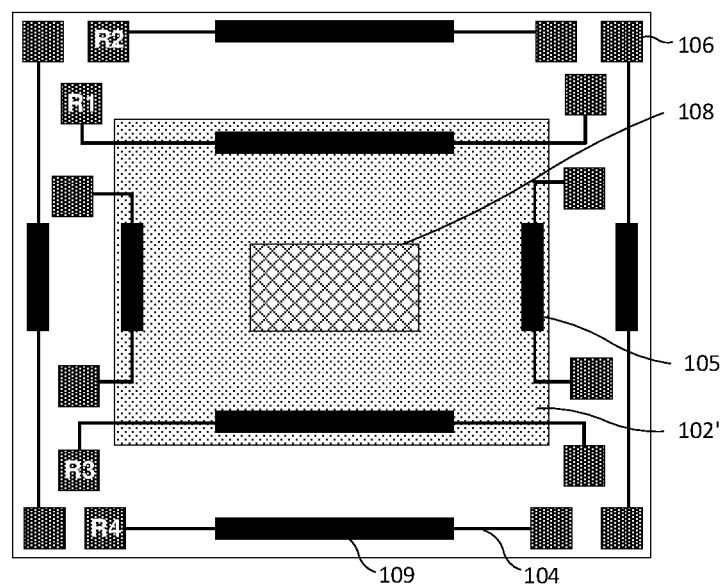
Figure 9A:
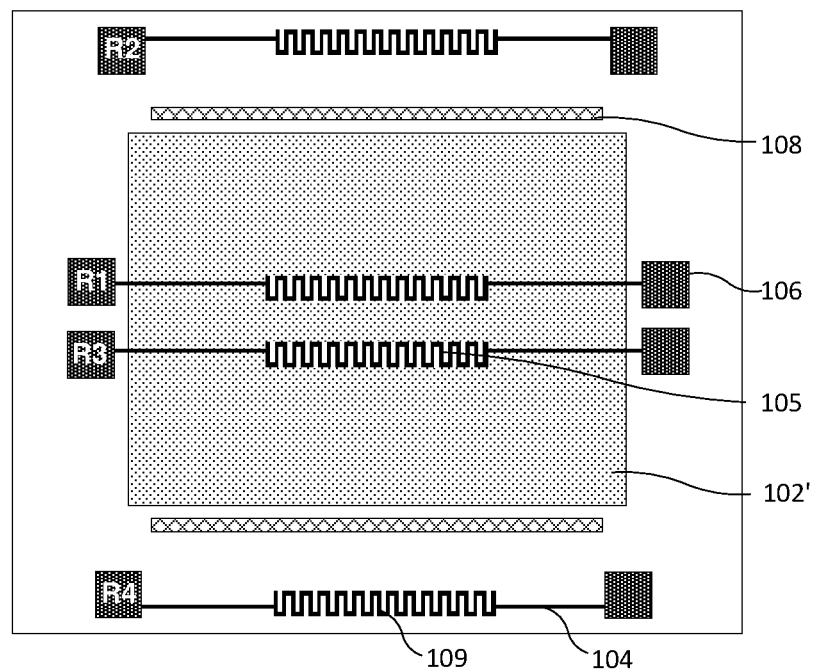
FIG. 9a and FIG. 9b are top views of the other two magnetoresistive inertial sensor chips according to embodiments of the present invention.
Figure 9B:
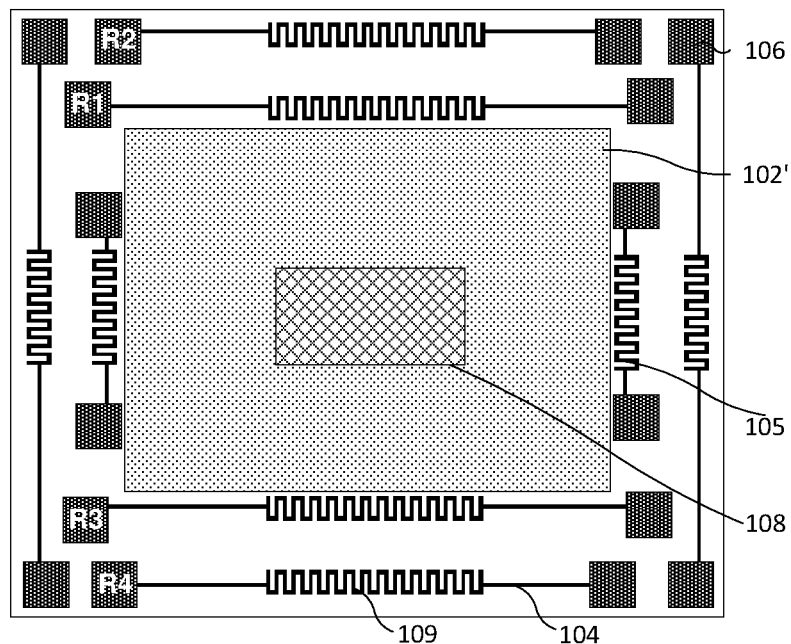

FIG. 8a and FIG. 8b are top views of the other two magnetoresistive inertial sensor chips according to embodiments of the present invention; and FIG. 9a and FIG. 9b are top views of the other two magnetoresistive inertial sensor chips according to embodiments of the present invention. Referring to FIG. 8a to FIG. 8b and FIG. 9a to FIG. 9b, top views of representative anisotropic magnetoresistive/giant magnetoresistive sensors according to the present invention are illustrated. The magnetoresistors are arranged in a strip or wave shape, and electrodes lead out magnetoresistor change signals. The permanent magnet thin film may be arranged at the central position of the vibrating diaphragm, and the magnetizing direction is perpendicular to the surface of the diaphragm or parallel to any pair of edges of the diaphragm. As impacted by external vibration/acceleration/pressure, the diaphragm drives the permanent magnet thin film to move in a direction perpendicular to the diaphragm, causing a change in the magnetic field strength at the positions of the magnetoresistors, and then causing a change in the resistance values of the magnetoresistors. Alternatively, the magnetoresistors are arranged at the central position inside the projection of the cavity, and the permanent magnet thin film is arranged outside the vertical projection area of the cavity on the vibrating diaphragm portion. As impacted by external vibration/acceleration/pressure, the diaphragm moves in a direction perpendicular to the diaphragm, causing a relative displacement between the magnetoresistors and the permanent magnet thin film on the diaphragm, such that the magnetic field strength at the positions of the magnetoresistors changes, thereby causing a change in the resistance values of the magnetoresistors. Meanwhile, reference magnetoresistors R2 and R4 are arranged at positions outside the cavity. The reference magnetoresistors are not affected by the magnetic field generated by the permanent magnet thin film, and their resistance values remain unchanged when the vibrating diaphragm vibrates. If necessary, a magnetic shielding layer may be provided above the reference magnetoresistors R2 and R4. When required by an application scenario, the reference resistors R2 and R4 and the magnetic field sensing magnetoresistors R1 and R3 are linked in the form of a reference full bridge or reference half bridge to convert vibration into an electric signal for output.

Figure 10A:
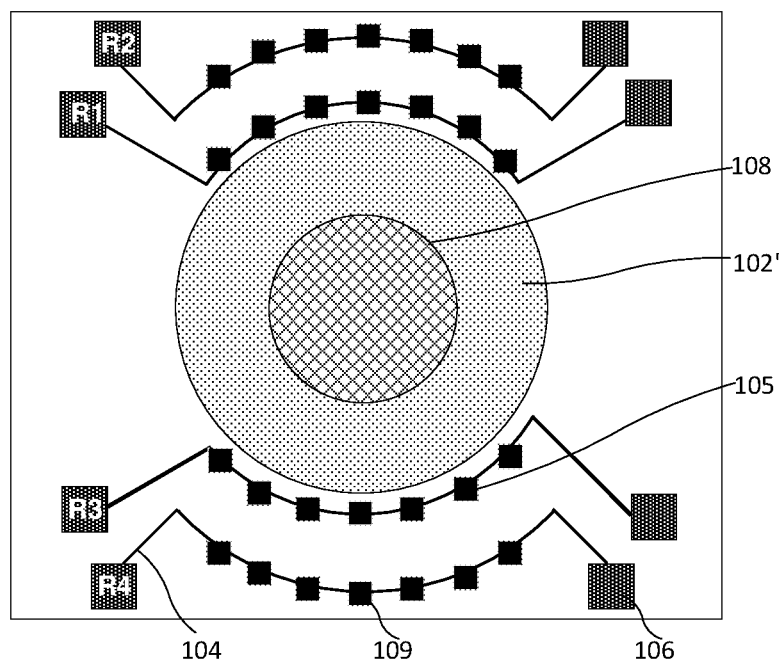

FIG. 10a and FIG. 10b are top views of the other two magnetoresistive inertial sensor chips according to embodiments of the present invention. The thickness of the vibrating diaphragm may be selected to be 0.001 μm to 1000 μm, the edge of the contact face between the cavity and the vibrating diaphragm is a circle, an ellipse, a rectangle, or a parallelogram, and the length-width ratio of the enclosing rectangle of the contact face between the cavity and the vibrating diaphragm is in a range of 20:1 to 1:1, wherein the width of the enclosing rectangle of the contact face is in a range of 0.1 μm to 2000 μm. Referring to FIG. 10a and FIG. 10b, according to a specific embodiment of the present invention, when the edge of the contact face between the cavity and the vibrating diaphragm is a circular structure, the magnetoresistors and the permanent magnet thin film are respectively arranged in an arc shape inside and outside the projection of the cavity. The working principle and linking mode thereof are the same as the design of a rectangular diaphragm. A magnetic shielding layer may cover the top of the reference magnetoresistors R2 and R4.

FIG. 11a to FIG. 11d are schematic diagrams of magnetoresistive bridge connection modes according to embodiments of the present invention. Referring to FIG. 11a to FIG. 11d, in the magnetoresistive inertial sensor chip, the lining mode of the magnetic field sensing magnetoresistor and the reference magnetoresistor comprises reference full bridge, reference half bridge, and push-pull half bridge, or the magnetic field sensing magnetoresistor separately forms a structure with a single arm.

Figure 12:
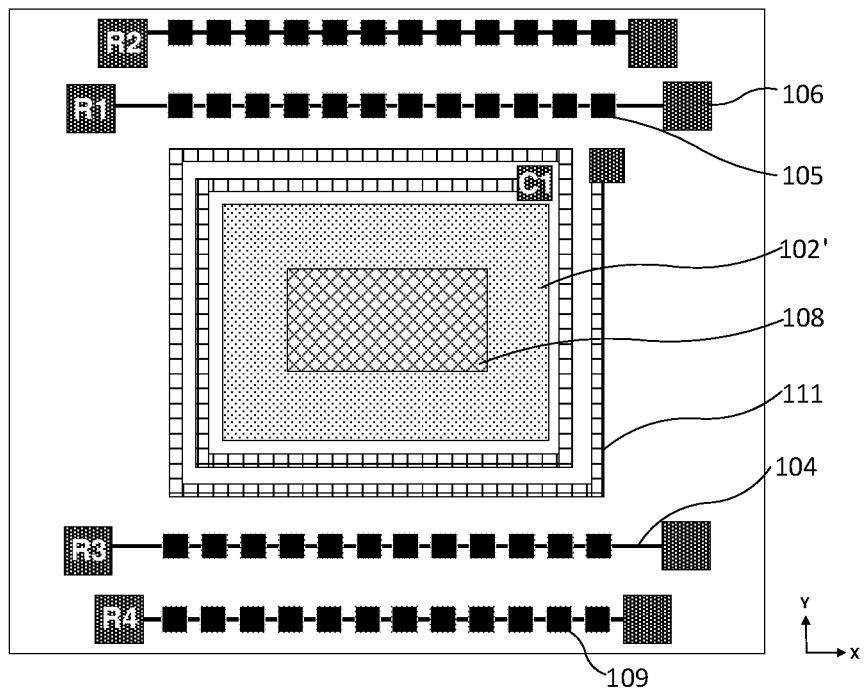
FIG. 12 is a top view of another magnetoresistive inertial sensor chip according to an embodiment of the present invention.
Figure 13A:
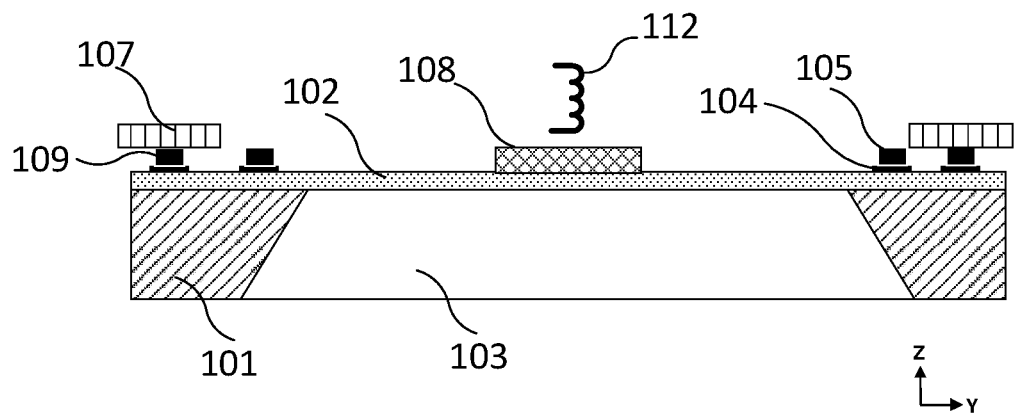
FIG. 13a to FIG. 13c are schematic structural diagrams of the other three magnetoresistive inertial sensor chips according to embodiments of the present invention.
Figure 13B:
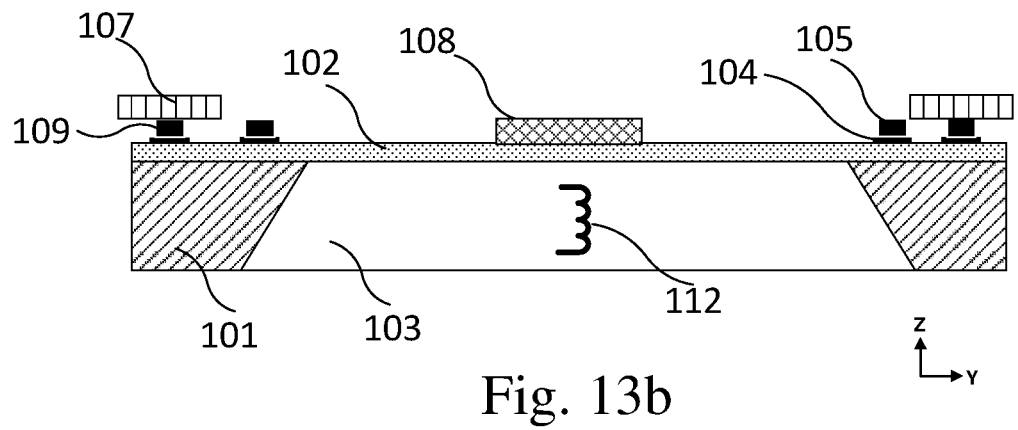
Figure 13C:
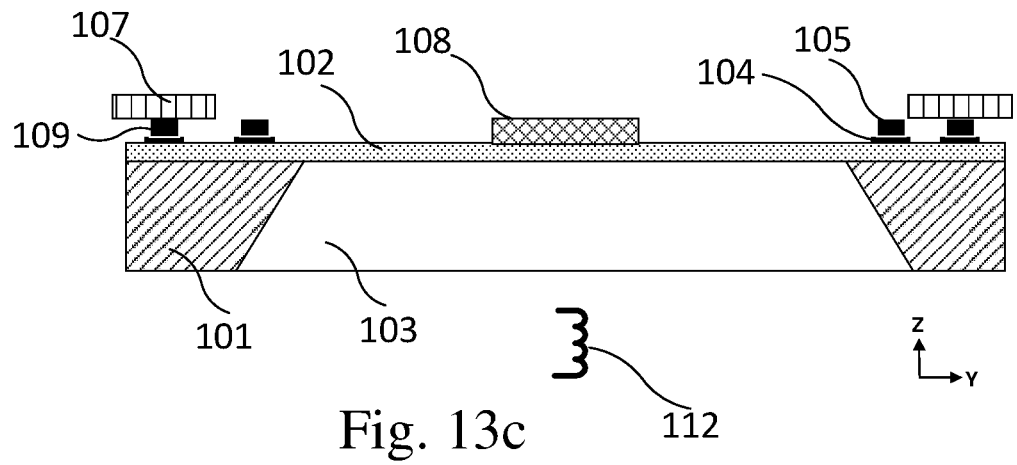

FIG. 12 is a top view of another magnetoresistive inertial sensor chip according to an embodiment of the present invention; and FIG. 13a to FIG. 13c are schematic structural diagrams of the other three magnetoresistive inertial sensor chips according to embodiments of the present invention. Referring to FIG. 12 and FIG. 13a to FIG. 13c, the sensor chip may be provided with a feedback coil. When the magnetoresistance changes as a result of displacement of the permanent magnet thin film 108, the resultant voltage/current change is amplified by a circuit, and then loaded to the feedback coil to produce a magnetic field with the same change but an opposite direction relative to that of the permanent magnet thin film 108, such that the vibrating diaphragm moves close to the balance point, so as to increase the measurement dynamic range of the inertial sensor.

As shown in FIG. 12, the magnetoresistive inertial sensor chip may be provided with a plane etched coil 111. The plane etched coil 111 may be formed through the plane etching process, and the plane etched coil 111 is located on the top surface of the vibrating diaphragm and is arranged in an area other than the vertical projection area of the contact face between the cavity and the vibrating diaphragm.

As shown in FIG. 13a to FIG. 13c, the sensor chip may be provided with a winding coil 112, and meanwhile, the magnetic shielding layer 107 may cover the top of the reference magnetoresistor 109. The winding coil 112 is disposed right above the permanent magnet thin film 108 or disposed right below the permanent magnet thin film 108 and is arranged below the cavity 103 or inside the cavity 103.

Figure 14A:
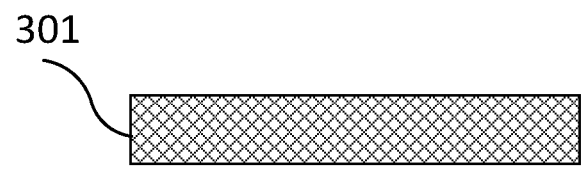
FIG. 14a to FIG. 14f are respectively schematic diagrams of representative settings of a permanent magnet thin film material.
Figure 14B:
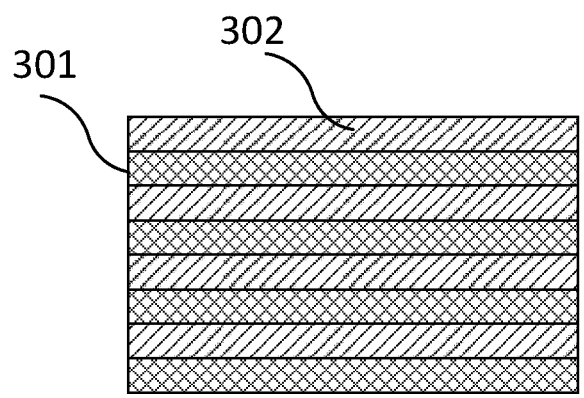
Figure 14C:
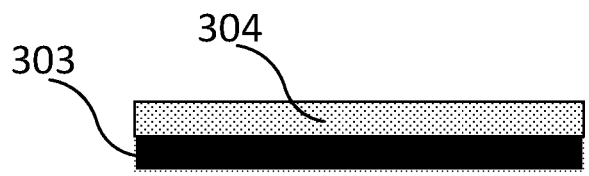
Figure 14D:
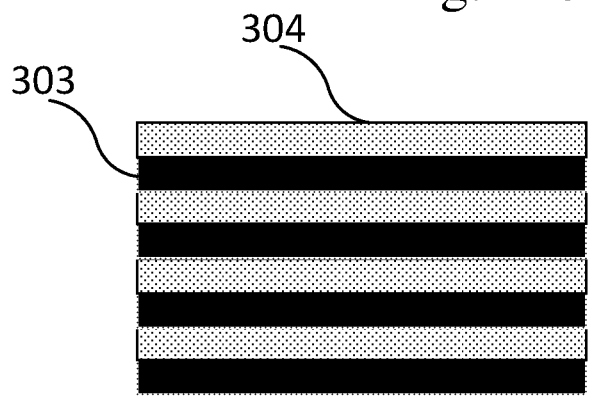
Figure 14E:
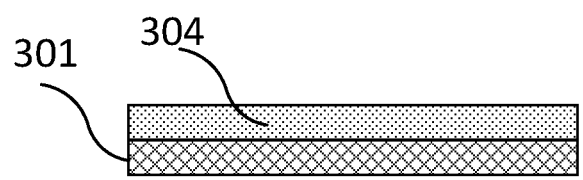
Figure 14F:
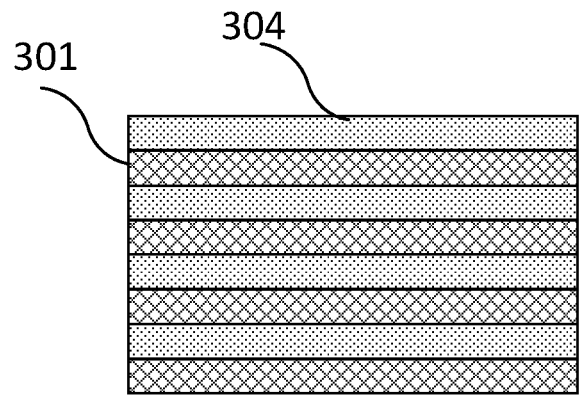

The permanent magnet thin film may be one or more layers of hard magnetic materials, with representative materials thereof being CoPt, CoCrPt, and FePt, or [soft magnet/antiferromagnet]n formed by composite units consisting of a soft magnetic material and an antiferromagnetic material, or [soft magnet/hard magnet]n formed by composite units consisting of a soft magnetic material and a hard magnetic material, wherein n is a natural number, the representative soft magnetic materials comprise FeCo and NiFe, and the representative antiferromagnetic materials comprise PtMn and IrMn. FIG. 14a to FIG. 14f are respectively schematic diagrams of representative settings of a permanent magnet thin film material. Specifically, as shown in FIG. 14a to FIG. 14f, the permanent magnet thin film may comprise: the single hard magnetic thin film 301 as shown in FIG. 14a, or the two or more compound hard magnetic thin film as shown in FIG. 14b, where FIG. 14b illustrates a circumstance in which two types of hard magnetic thin films 301 and 302 are alternately stacked; the soft magnet 304/antiferromagnet 303 compound thin film as shown in FIG. 14c; the multi-layer alternately stacked [soft magnet 304/antiferromagnet 303]n thin film as shown in FIG. 14d, the soft magnet 304/hard magnet compound thin film 301 as shown in FIG. 14(e), and the multi-layer alternately stacked [soft magnet 304/hard magnet 301]n thin film as shown in FIG. 14f, wherein n is a natural number.

All other embodiments obtained by those of ordinary skills in the art based on the embodiments in the present invention and without creative effort shall fall within the scope of protection of the present invention. Although the present invention illustrates and describes the preferred implementations, those skilled in the art shall understand that various variations and modifications may be made to the present invention as long as they do not exceed the scope defined by the claims of the present invention.

The invention claimed is:

1. A magnetoresistive inertial sensor chip, comprising:
   a substrate,
   a vibrating diaphragm,
   a magnetic field sensing magnetoresistor, and
   at least one permanent magnet thin film, wherein
   the vibrating diaphragm is located on one side surface of the substrate, the magnetic field sensing magnetoresistor and the permanent magnet thin film are set on the surface of the vibrating diaphragm away from the base of the substrate, a contact electrode is also arranged on the surface of the vibrating diaphragm away from the base of the substrate, and the magnetic field sensing magnetoresistor is connected to the contact electrode through a connecting lead; and
   the substrate comprises a cavity formed through etching, either one or both of the magnetic field sensing magnetoresistor and the permanent magnet thin film are arranged in a vertical projection area of the cavity on the vibrating diaphragm, and a component of a magnetic field generated by the permanent magnet thin film in a sensitivity direction of the magnetic field sensing magnetoresistor changes, causing the resistance value of the magnetic field sensing magnetoresistor to change, thereby leading to a change in an output electric signal.

2. The magnetoresistive inertial sensor chip according to claim 1, wherein:
   the magnetic field sensing magnetoresistor is arranged in an area other than the vertical projection area of the cavity on the vibrating diaphragm, and the permanent magnet thin film is arranged at a central position of the vertical projection area of the cavity on the vibrating diaphragm;
   the magnetic field sensing magnetoresistor is arranged on an inner edge of the vertical projection area of the cavity on the vibrating diaphragm, and the permanent magnet thin film is arranged at the central position of the vertical projection area of the cavity on the vibrating diaphragm;

the magnetic field sensing magnetoresistor is arranged at the central position of the vertical projection area of the cavity on the vibrating diaphragm, and the permanent magnet thin film is arranged in an area other than the vertical projection area of the cavity on the vibrating diaphragm.

3. The magnetoresistive inertial sensor chip according to claim 1, wherein the magnetoresistive inertial sensor chip further comprises a reference magnetoresistor, the reference magnetoresistor is located on the surface of the vibrating diaphragm away from the base of the substrate and is arranged in an area other than the vertical projection area of the cavity on the vibrating diaphragm, and the reference magnetoresistor and the magnetic field sensing magnetoresistor are connected into a full-bridge or half-bridge structure through an encapsulation lead.

4. The magnetoresistive inertial sensor chip according to claim 3, wherein a side of the reference magnetoresistor away from the vibrating diaphragm is provided with a magnetic shielding layer comprising a soft magnetic material, and the magnetic shielding layer covers the reference magnetoresistor.

5. The magnetoresistive inertial sensor chip according to claim 3, wherein the reference magnetoresistor and the magnetic field sensing magnetoresistor are a tunneling magnetoresistor, a giant magnetoresistor, or an anisotropic magnetoresistor.

6. The magnetoresistive inertial sensor chip according to claim 1, wherein the magnetoresistive inertial sensor chip further comprises an encapsulation structure consisting of an encapsulation substrate and an encapsulation housing, and the substrate is disposed inside a cavity formed by the encapsulation substrate and the encapsulation housing and is fixed on the encapsulation substrate.

7. The magnetoresistive inertial sensor chip according to claim 6, wherein the encapsulation housing comprises one or more layers of magnetic field shielding shells made of soft magnetic materials, one or more layers of electric field shielding shells made of metal foils, or a shell formed by stacking the magnetic field shielding shells and the electric field shielding shells.

8. The magnetoresistive inertial sensor chip according to claim 6, wherein the encapsulation substrate or the encapsulation housing is provided with at least one opening.

9. The magnetoresistive inertial sensor chip according to claim 1, wherein a thickness of the vibrating diaphragm is 0.001 μm to 1000 μm, an edge of a contact face between the cavity and the vibrating diaphragm is a circle, an ellipse, a rectangle, or a parallelogram, and the length-width ratio of the enclosing rectangle of the contact face between the cavity and the vibrating diaphragm is in a range of 20:1 to 1:1, wherein a width of the enclosing rectangle of the contact face is in a range of 0.1 μm to 2000 μm.

10. The magnetoresistive inertial sensor chip according to claim 1, wherein the vibrating diaphragm comprises a plurality of through holes formed through etching.

11. The magnetoresistive inertial sensor chip according to claim 1, wherein the permanent magnet thin film is one or more layers of hard magnetic materials, or [soft magnet/antiferromagnet]n formed by composite units consisting of a soft magnetic material and an antiferromagnetic material, or [soft magnet/hard magnet]n formed by composite units consisting of a soft magnetic material and a hard magnetic material, wherein n is a natural number, the hard magnetic material comprises at least one of CoPt, CoCrPt, and FePt, the soft magnetic material comprises at least one of FeCo and NiFe, and the antiferromagnetic material comprises at least one of PtMn and IrMn.

12. The magnetoresistive inertial sensor chip according to claim 1, wherein a magnetizing direction of the permanent magnet thin film is in a plane of the permanent magnet thin film or perpendicular to the-plane of the permanent magnet thin film, and the sensitivity direction of the magnetic field sensing magnetoresistor is in the plane of the permanent magnet thin film or perpendicular to the plane of the permanent magnet thin film.

13. The magnetoresistive inertial sensor chip according to claim 1, wherein the sensor chip comprises a feedback coil;
the feedback coil is a plane etched coil that is located on the surface of the vibrating diaphragm away from the base of the substrate and is arranged in an area other than the vertical projection area of the cavity on the vibrating diaphragm,
or the feedback coil is a winding coil disposed right above the permanent magnet thin film or disposed right below the permanent magnet thin film and is arranged below the cavity or inside the cavity.

\* \* \* \* \*

UNITED STATES PATENT AND TRADEMARK OFFICE
CERTIFICATE OF CORRECTION

PATENT NO. : 11,940,299 B2
APPLICATION NO. : 17/594149
DATED : March 26, 2024
INVENTOR(S) : Qi et al.

Page 1 of 1

It is certified that error appears in the above-identified patent and that said Letters Patent is hereby corrected as shown below:

In the Claims

In Column 13, Line 4, in Claim 2, after "diaphragm;", insert --or--

In Column 14, Line 30, in Claim 12, delete "the-plane" and insert --the plane-- therefor Signed and Sealed this
Seventh Day of May, 2024

Katherine Kelly Vidal
*Director of the United States Patent and Trademark Office*